United States Patent

[11] 3,612,954

[72] Inventors Robert Steven Silver
Kendall Park, N.J.;
John Jaklik, Jr., Bristol, Pa.

[21] Appl. No. 876,013
[22] Filed Nov. 12, 1969
[45] Patented Oct. 12, 1971
[73] Assignee RCA Corporation

[54] SEMICONDUCTOR DIODE ARRAY VIDICON TARGET HAVING SELECTIVELY INSULATED DEFECTIVE DIODES
3 Claims, 3 Drawing Figs.

[52] U.S. Cl. .......... 317/235 R, 317/235 N, 317/235 T, 317/235 AG, 315/10, 313/108
[51] Int. Cl. .......... H01l 17/00, H01l 15/00
[50] Field of Search .......... 317/235 (27), 235 (30), 235 (46), 235 N, 235 T, 235 AG; 148/1.5

[56] References Cited
UNITED STATES PATENTS

| | | | |
|---|---|---|---|
| 3,419,746 | 12/1968 | Crowell et al. | 315/10 |
| 3,391,035 | 7/1968 | Macintosh | 148/187 |

*Primary Examiner*—John W. Huckert
*Assistant Examiner*—Martin H. Edlow
*Attorney*—Glenn H. Bruestle

ABSTRACT: The target comprises a semiconductor substrate wafer and an array of semiconductor diodes formed in a wafer with contact surfaces exposed at a surface thereof. At least one "soft" diode of the diodes passes a greater current when back-biased at a given operating voltage than other "hard" diodes of the diodes pass at the operating voltage. An electrically insulating layer, selectively deposited to be thicker on the contact surfaces of the soft diodes than on the contact surfaces of the hard diodes, reduces the current through the soft diodes relative to the hard diodes at the operating voltage. The target may be prepared by the method which comprises the steps of:

covering all of the wafer but for the contact surfaces with a masking layer;

contacting the contact surfaces of the wafer with an oxidizing electrolyte solution, and applying an anodizing voltage across the wafer and the solution and permitting electrical current to pass through the diode array and the solution, whereby a thicker insulating layer selectively forms anodically on the contact surfaces of the soft diodes.

INVENTORS
Robert S. Silver and
John Jaklik, Jr.
BY
Volker R. Ulbrich
ATTORNEY

SEMICONDUCTOR DIODE ARRAY VIDICON TARGET HAVING SELECTIVELY INSULATED DEFECTIVE DIODES

BACKGROUND OF THE INVENTION

The invention relates to novel semiconductor diode array vidicon targets and to a method of preparing such targets to decrease degradation due to defective diodes which might be present and to salvage targets having defective diodes.

Semiconductor diode array vidicon targets such as the silicon targets described, for instance, in U.S. Pat. Nos. 3,011,089 to F. W. Reynolds and 3,403,284 to T. M. Buck et al., can contain defective, soft diodes. When the target diodes are back-biased at a given operating voltage, the soft diodes pass more current than the other, acceptable, hard diodes of the target. The presence of soft diodes in a target degrades its performance. Because of the small size and high area-density of the diodes in a silicon vidicon target, it is not feasible with present microprobing methods to test the diodes before incorporating the target in a tube or an equivalent environment. Moreover, even when it has been determined by operating a target that it contains soft diodes, it is presently not feasible, because of the small size and high area-density of the diodes, to either determine precisely which diode is soft or to treat a known soft diode individually to remedy the defect.

SUMMARY OF THE INVENTION

The novel target comprises an array of semiconductor diodes, at least one of which is defective (soft), in a semiconductor wafer at a surface thereof. A contact for each diode is exposed at the surface of the wafer. An electrically insulating layer, selectively thicker on the contacts of the soft diodes than on the contacts of the hard diodes, substantially reduces the current through the soft diodes relative to the hard diodes at the operating voltage without adversely affecting the operating characteristics of the hard diodes.

The target may be made by:

- forming the diodes including their contacts in the wafer;
- covering all but the contact surfaces of the wafer with a masking layer;
- contacting the contact surfaces of the wafer with an oxidizing electrolyte solution;
- applying an anodizing voltage across the wafer and the solution, the anodizing voltage being below the breakdown voltage of the hard diodes, and permitting electrical current to pass through the diode array to selectively form insulating material on the contact surfaces of the diodes. The thickness of the insulating material associated with the soft diodes is sufficient to reduce the current passing through the soft diodes to an acceptable value at the operating voltages. The thickness of the insulating material associated with the hard diodes is so thin that the operating characteristics of the hard diodes are substantially unaffected.

The selectively formed insulating layer of the novel target reduces or eliminates degrading effects of soft diodes in the target. A further advantage of the novel method is that insulating material may be deposited selectively on a diode array without first locating the soft diodes of the array. The process itself limits the amount of deposited material.

BRIEF DESCRIPTION OF THE DRAWINGS

FIG. 3 includes a schematic diagram of a circuit that may be used to practice the novel method.

DESCRIPTION OF THE PREFERRED EMBODIMENTS

Embodiment of the Novel Target

Figures 1, 2, 3:
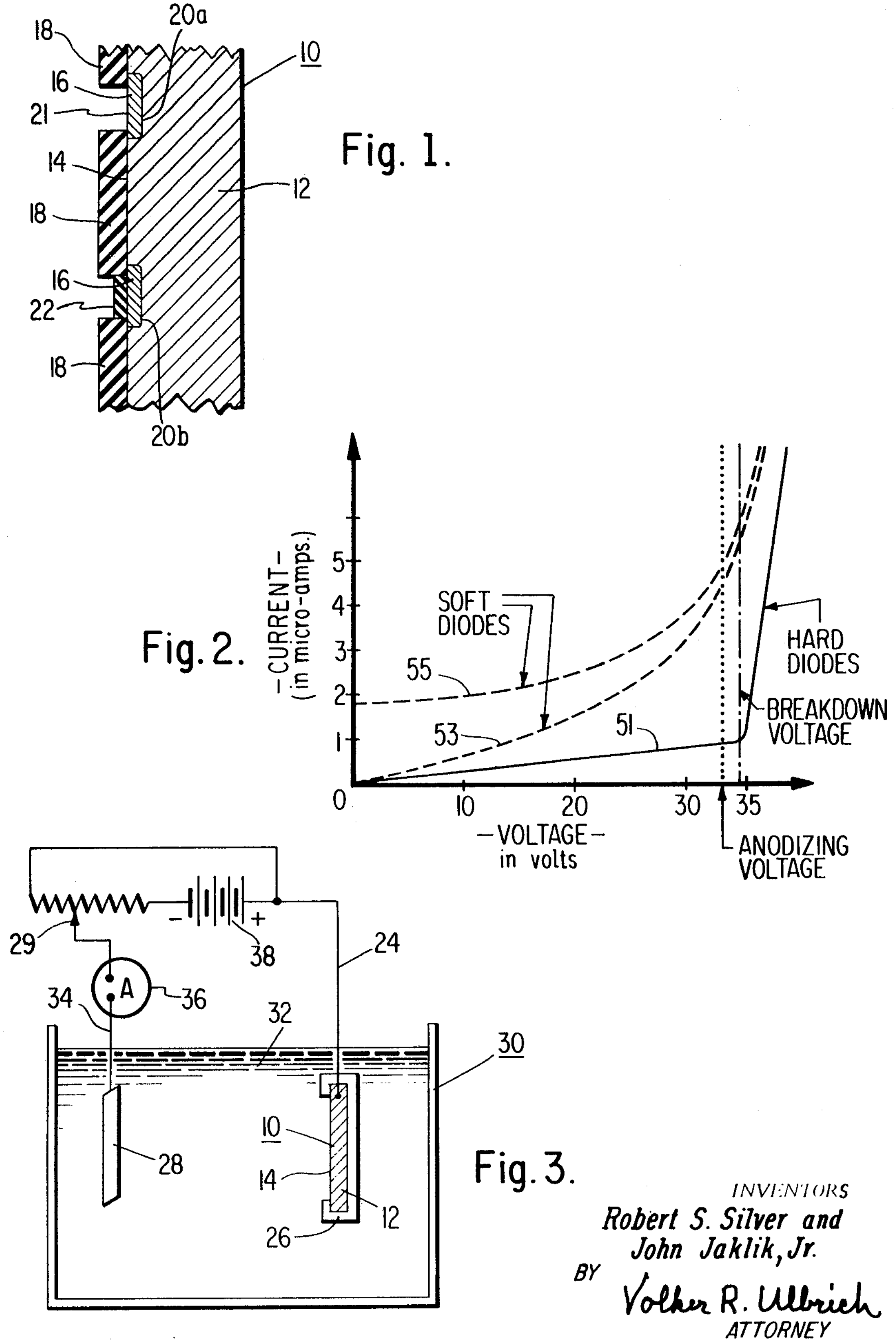
FIG. 1 is an enlarged and exaggerated, fragmentary, side sectional view of a silicon vidicon target having a hard diode and a soft diode to which the novel method has been applied.
FIG. 2 is a graph comparing roughly the electrical characteristics of diodes of the target of FIG. 1.
FIG. 3 is an elevational view of an apparatus that may be used for practicing the preferred embodiment of the novel method.

FIG. 1 shows a portion of a silicon vidicon target 10. The target 10 includes an N-type silicon wafer substrate 12 about 20 microns thick and about 2 cm. in diameter. On one surface of the substrate 12, the scanned surface 14, there is an array of discrete P-type regions 16 separated from one another by an insulating layer 18 of silicon dioxide on the surface 14 between the P regions 16. Thus, there is formed an array of PN junction diodes **20*a*, 20*b*, ... below the scanned surface 14. There are about 1839 diodes per lineal inch. The P regions of the diodes present exposed contact surfaces 21** to a scanning electron beam.

The great majority of the diodes **20*a*, 20*b*, ... have an acceptable current-voltage characteristic for the back-biased state. These diodes, such as the diode 20*a* in FIG. 1, will be referred to as hard diodes. The current-voltage characteristic for hard diodes, such as diode 20*a*, is roughly described in the graph of FIG. 2 by the solid line curve 51. However, some of the diodes, such as the diode 20*b* in FIG. 1, have an unacceptable current-voltage characteristic, as is described roughly by the dotted line curves 53 and 55 of FIG. 2. These diodes are referred to as soft diodes. They are characterized by exhibiting a substantially higher current when back-biased than hard diodes. In the novel target 10, the exposed contact surfaces 21 of the soft diodes, such as diode 20*b*, are covered with a layer 22** of electrically insulating material preferably formed by the novel method of the invention.

Embodiment of the Novel Method

The contact surfaces 21 of soft diodes, such as diode **20*b*, of an otherwise completed silicon vidicon target are selectively, electrochemically coated with a vitreous oxide insulator layer 22 shown in FIG. 1. An apparatus of the type shown in FIG. 3** is used for the electrochemical coating.

An anode lead 24 is connected to the substrate 12. With only the scanned surface 14 being left bare, the remainder of the target 10 is covered with a protective wax 26. The target 10 is then placed as anode opposite a platinum cathode electrode 28 in an electrochemical cell 30 in which the electrolyte 32 is about 10 percent potassium hydroxide and 90 percent water. An electrical lead 34 from the cathode electrode 28 is connected through a potentiometer 29 and an electrical current meter 36 to the negative terminal of a battery 38. The anode lead 24 is connected to the positive terminal of the battery 38. By increasing the voltage while carefully monitoring the current through the meter 36, the voltage is brought to an anodizing voltage just below the breakdown voltage. As used herein, "breakdown voltage" means the breakdown voltage of the hard diodes **20*a*. "Anodizing voltage" means the voltage applied across the array to form the insulating material. The anodizing voltage for the preferred embodiment is shown by the dotted line in FIG. 2. At the anodizing voltage, which is generally between about 30 and 200 volts and within about 10 volts of the breakdown voltage of the hard diodes, the current for the entire array is on the order of 1 microampere. For the particular target 10 of the preferred embodiment the breakdown voltage was about 38 volts, the anodizing voltage about 35 volts, and the time for anodization was about 20 minutes. The breakdown voltage for a target depends on several factors including substrate resistivity and diffusion depth of impurities in the P regions 16. It may be readily determined, for instance, by contacting the diodes with a mercury probe and observing the voltage current characteristics with an oscilloscope. It is found that under the general back-bias conditions of the anodizing voltage, a water-insoluble, electrically insulating material 22 is electrochemically formed on the contact surfaces 21 of the diode 20*b*. The insulating material 22 is believed to be an oxide of silicon. The rate at which the insulating material 22 is formed on a particular surface 21 is directly proportional to the electrical current at that area. Thus, the soft diodes such as diode 20*b*, are coated rapidly with an insulating layer 22 about 0.2 micron thick while the hard diodes, such as diode 20*a*, are coated with a relatively thin insulating layer 22 less than about 0.025 micron thick. The coating process is self-limiting, since the current drops off as the thickness of the layer 22 increases. The effect of the layer 22 is to bring the current of the soft diodes 20*b* down to essentially the same current as that of the hard diodes 20*a*. The target 10 is next removed from the cell 30 and rinsed for about 5 seconds in a 98 percent water-2 percent hydrogen fluoride solution at about 26° C. to remove just enough of the insulating layer 22 to bare the contact surfaces 21 of the hard diodes 20*a*, but to leave the insulating layer 22 on the contact surfaces 21 of the soft diodes 20*b***.

General Considerations

A soft diode generally loses essentially all its charge within a normal 1/30-second scanning time of a commercial vidicon, regardless of the intensity of light generating carriers near it. Therefore, it shows a maximum signal output each time it is scanned. As a result, even a single soft diode in the target may produce a signal which is subsequently displayed as a brilliant white spot against a background of a normally lighted scene to a viewer. As the background scene illumination is decreased, the white spot seems to increase in brightness because of the increasing contrast between it and the background. The disturbing effect to the viewer of a white spot in the signal is believed to be primarily a psychological phenomenon, for only a minute amount of signal information is lost with a single diode. The greater the contrast of the spot with the background, the greater is the disturbing effect. Since silicon vidicons are in other respects especially well suited for low light level pickup, soft diodes in a target are glaring distractions under normal operating conditions, and a target with several brilliant white spots is generally unsuitable for commercial use.

The insulating layer on the soft diodes of the novel target stores electronic charge during scanning and prevents the soft diodes from being affected by the electron beam to give a signal. As a result, a soft diode which would otherwise appear as a brilliant white spot in the signal is changed to appear as either a dark gray or black spot. The shade of gray of the spot depends upon the thickness of the insulating layer on the diode. For normally illuminated scenes or low light level scenes, the presence of the dark spots in the signal is considerably less disturbing to the viewer than if the spots were a bright white. Thus, targets which would otherwise be useless commercially can be rendered acceptable by the novel method.

For targets with a very high area density of diodes, such as for the preferred embodiment of the novel target, the scanning beam contacts several diodes at once. In this case the lack of signal from an inoperative, nonconducting diode is averaged out by the signals from immediately surrounding diodes. Thus, a single soft diode covered with a sufficiently thick insulating layer is not perceptible in the displayed signal. On the other hand, the same diode but without the insulating layer nevertheless may appear in the displayed signal as a brilliant spot. The reason for this is thought to be that under ordinary lighting conditions the amount of signal contributed by an uncovered soft diode is far greater than the amount of signal lost when it is covered by an insulating layer.

The novel method is applicable also to silicon vidicon targets which are provided with contact pads on the diodes, as described for instance in the above-referenced U.S. patents. With such a target structure, the insulating coating forms on the pads.

The insulating layer on the soft diodes has a contrasting appearance to silicon or silicon oxide and is readily distinguishable under a microscope. Thus, visual determination of the yield of hard diodes in the target may be made without operation of the target in a camera tube environment.

Not all defective diodes in a diode array target have the same current-voltage characteristics. The dashed line curves 53, 55 in FIG. 2 illustrate two common types of characteristics of defective diodes. Defective diodes which degrade the performance of a target usually have a current-voltage characteristic which can be represented by one of a family of curves lying entirely above the curve 51 of hard, acceptable diodes at least in the voltage range of from just above zero to just below the breakdown voltage. For convenience, all such defective diodes are referred to herein as soft diodes. One thing common to the various soft diodes is that at a given back-bias voltage just below the breakdown voltage, the relative current passing through the soft diodes is far greater than that passing through the hard diodes. The insulating layer formed on the contact surfaces of the diodes of the novel target by the novel method reduces the relative current passing through the soft diodes at a given operating voltage below the breakdown voltage. It is an important feature of the novel method that the self-limiting aspect of the layer formation tends to reduce current differences between diodes at a given operating voltage back-bias to a minimum, and to thereby maximize the uniformity of the signal from the target. Soft diodes with a relatively high current at a relatively low back-bias can be coated at forming voltages much lower than the breakdown voltage. However, soft diodes whose current-voltage characteristic more closely follows that of the hard diodes such as shown by the lower dashed curve in FIG. 2 cannot be coated with sufficient selectivity unless the forming voltage for the coating is just below the breakdown voltage. It is a feature of the novel method that soft diodes whose characteristic closely follows that of hard diodes are selectively coated, along with other types of soft diodes, by using an anodizing voltage just below the breakdown voltage.

The concentration of potassium hydroxide in the electrolyte 32 of the preferred embodiment is not critical and may vary in strength between 1 and 20 percent potassium hydroxide. Variations can be made in the coating by using other types of coating solutions than potassium hydroxide, including organic mixtures. By "oxidizing electrolyte" is meant an electrolyte which is capable of forming an anodic oxide of the semiconductor target substrate wafer. The concentration of the electrolyte is chosen to result in a coating rate fast enough to accomplish the coating in a reasonable time, but not so fast that control is lost. Other anodization techniques may also be used to form the coating, so long as the anodizing voltage is just below the breakdown potential. Examples of anodizing techniques may be found, for instance, in "Electrograph Method for Locating Pinholes in Thin Silicon Dioxide Films," by J. P. McCloskey, *J. Electrochem. Soc.*, June 1967, p. 644.

The concentration of hydrogen fluoride in the etching solution of the preferred embodiment is not critical. The solution may have between about 1 to about 10 percent hydrogen fluoride and between about 99 and 90 percent water, depending on the desired etching rate. Other means of etching, such as sputtering or electrochemical etching may be used.

It is important that anodizing voltage applied to the target 10 to form an insulating layer 22 on the contact surfaces 21 be just below the breakdown voltage. It is desirable, for instance, to have the forming voltage within about 5 percent of the breakdown voltage. It has been found that if the forming voltage is not within about 10 volts of the breakdown voltage there is not enough difference in current between the hard diodes and the soft diodes to result in a significant reduction of relative current in the soft diodes **20*b***.

The thickness of the coating that is removed in the etching step after the coating process is also not critical to the operation of the target. Even if none is removed at all, the coating on the hard diodes is generally so thin that the operation of the target is substantially unaffected, since beam electrons can tunnel through a thin layer. The signal of the target can be slightly increased, however, by removing some or all of the insulating layer on the hard diodes.

It is an additional advantage of the novel method that pinholes in the layer 18 separating the P regions 16 on the target are also affected by the coating process so that they do not degrade the performance of the target by being visible as white spots.

We claim:

1. A semiconductor diode array vidicon target, comprising:

a. a semiconductor wafer;

b. an array of PN junction semiconductor diodes formed in said wafer with contact surfaces exposed on or near a surface thereof, said array consisting predominantly of first diodes having a given back bias current-voltage characteristic and including at least one second diode having a substantially higher back bias current-voltage characteristic at a voltage below the breakdown voltage of said first diodes, and c. an electrically insulating layer on at least said contact surfaces of said second diodes, said layer being thicker on said contact surfaces of said second diodes than where present on said contact surfaces of said first diodes.

2. The target defined in claim 1 and wherein said semiconductor is silicon and said insulating layer is a vitreous material having a different color from the color of said contact surfaces.

3. The target defined in claim 1 and wherein said insulating layer is an oxide of said semiconductor wafer.